United States Patent [19]
Chirovsky et al.

[11] Patent Number: 5,233,184
[45] Date of Patent: Aug. 3, 1993

[54] MATRIX ADDRESSED S-SEED OPTICAL MODULATOR ARRAY

[75] Inventors: Leo M. F. Chirovsky, Bridgewater, N.J.; Anthony L. Lentine, St. Charles, Ill.; David A. B. Miller, Fair Haven, N.J.

[73] Assignee: AT&T Bell Laboratories, Murray Hill, N.J.

[21] Appl. No.: 815,082

[22] Filed: Dec. 27, 1991

[51] Int. Cl.⁵ .............................. H01J 40/14
[52] U.S. Cl. ................. 250/214 LS; 377/102
[58] Field of Search .......... 250/214 LS, 208.4, 211 J; 359/117, 135, 122, 115; 377/102; 370/16, 60

[56] References Cited
U.S. PATENT DOCUMENTS 4,952,791 8/1990 Hinton et al. ............... 250/211 J
4,967,068 10/1990 Lentine et al. .............. 250/213 A

OTHER PUBLICATIONS

"Applied Physics Letters," 57, No. 18, pp. 1843-1845, Oct. 1990. by G. D. Boyd et al.

*Primary Examiner*—David C. Nelms
*Assistant Examiner*—T. Davenport
*Attorney, Agent, or Firm*—Richard D. Laumann

[57] ABSTRACT

Monolithic optically bistable modulator arrays, such as an M×N array of S-SEEDs, are electrically addressed with a matrix of electrical row and column contacts. Connected to the center node of each S-SEED is an addressing means having elements, such as diodes, transistors, or capacitors, which are electrically enabled and disabled.

9 Claims, 6 Drawing Sheets

MATRIX ADDRESSED S-SEED OPTICAL MODULATOR ARRAY

TECHNICAL FIELD

This invention relates to electrically matrix addressed monolithic arrays of optical modulators.

BACKGROUND OF THE INVENTION

Optical processing is of interest because free space optics can be used to connect two dimensional arrays of optical devices or circuits for parallel processing. Parallel processing so accomplished will, it is hoped, offer capabilities due to its massive connectivity which are not readily available in a purely electronic system. Some contemplated optical devices or circuits, which may be useful in such arrays, require connections for electrical signals to the individual optical devices or circuits.

For small arrays, the number of individual devices is small and each device can be electrically contacted individually with relative ease. For example, consider a 4×4 array which has a total of 16 individual devices and requires only 16 electrical connections. However, a 32×32 array would require at least 1024 electrical connections. While such a large number of electrical connections can be made with present technology, still larger arrays are contemplated and will require even more electrical connections. The number of connections required for such arrays will be prohibitively large for individual connections to devices to be made practically.

While individual connections to devices are desirable because they permit the entire array to be reconfigured in a single cycle, a matrix addressing scheme would reduce the number of electrical connections required although the array reconfiguration time might be increased. In a matrix addressing scheme, devices are addressed by row and column. For example, consider a 64×64 array of devices. A matrix addressing scheme would require only 128 electrical connections while 4096 connections would be required if the devices were contacted individually. The entire array will require 64 cycles for reconfiguration, and the array must have some form of memory mechanism during reconfiguration.

An attractive device for use in an array of optical devices is termed the S-SEED. The term is an acronym for symmetric self-electro optic effect device. The device has two reversed biased p-i-n diodes connected in series with the i-region of the diode having at least one quantum well. Each diode acts as the load for the other diode. The device relies upon the quantum confined Stark effect (QCSE) for its operation. S-SEEDs, which are now well known to those skilled in the art, have many attractive features such as optical bistability, cascadability, three-terminal operation, and small switching energies. See, for example, *Applied Physics Letters*, 57, pp. 1843-1845, Oct. 29, 1990, for a description of S-SEEDs.

However, electrical matrix addressing schemes for S-SEEDs which exhibit optical bistability have not been implemented. A matrix addressing scheme can not be implemented with only two connections to the S-SEED; i.e., with only connections to the outer nodes of the series connected diode pair.

SUMMARY OF THE INVENTION

An electrically addressed array of optical devices or circuits has a plurality of bistable S-SEED differential modulators with the modulators being arranged in a plurality of columns and a plurality of rows. The array has a plurality of addressing means with one addressing means being electrically connected to the center node of one S-SEED differential modulator. The addressing means, comprising an element which can be enabled and disabled electrically, sets the desired state and thereafter permits the S-SEED center node to float electrically. A plurality of electrical column buses and a plurality of electrical row buses make electrical contacts to the addressing means and to the modulators. At least one of the column and row buses is connected to the addressing means.

In one embodiment the addressing means comprise diodes. In another embodiment, the addressing means comprise transistors. In yet another embodiment, the addressing means comprise capacitors.

BRIEF DESCRIPTION OF THE DRAWINGS

For reasons of clarity, the elements depicted are not drawn to scale. Identical numerals in different FIGURES represent identical elements.

DETAILED DESCRIPTION

The invention will be described by reference to particular exemplary embodiments using bistable S-SEEDs as the optical differential modulators. However, it is believed that the operation of an array will be better understood if the switching of a single, self-biased S-SEED and a single cell having a self-biased S-SEED and diode addressing means are described first.

S-SEEDs are well known and their structure need not be described in detail. Those skilled in the art will readily fabricate such devices and the addressing means. See, for example, Chirovsky et al, OSA Proceedings on Photonic Switching, pp. 2-6, Midwinter and Hinton eds, OSA, Washington, DC. 1989 for a description of the structure and operation of S-SEEDs and an exemplary fabrication process. These devices exhibit, as mentioned, optical bistability which provides the necessary memory mechanism. It is believed that by first describing the operation of a single cell having a self-biased S-SEED as the optical differential modulator and addressing means, comprising a diode, connected to the center node of the S-SEED, the operation of the array will be more easily understood by those skilled in the art. Self-biased SEEDs represent a limiting case and are relatively easy to understand. Other embodiments, including ones in which the S-SEED has an applied bias, will then be discussed.

Figure 1:
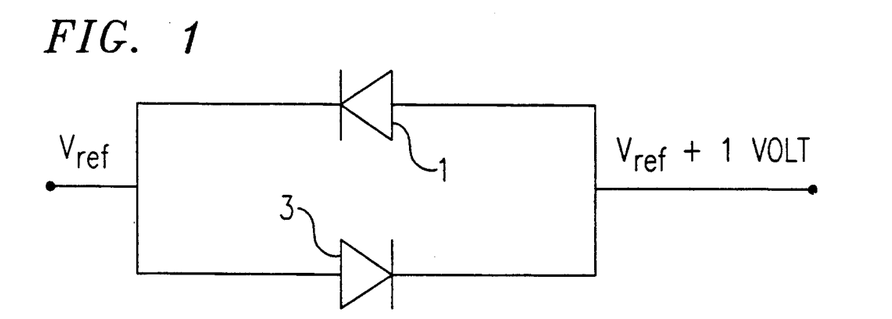
FIGS. 1-3 are useful in explaining the switching of a bistable self-biased S-SEED.
Figure 2:
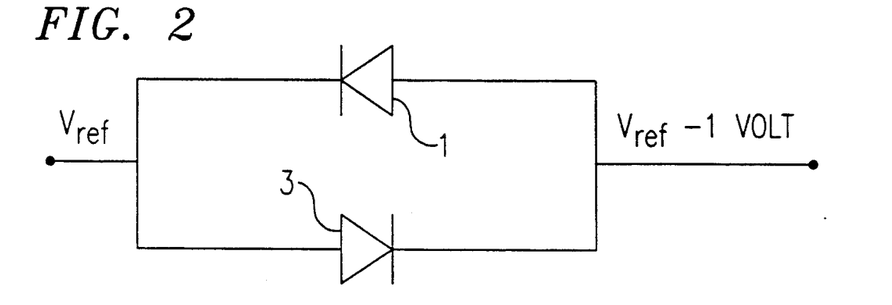

A self-biased S-SEED is a symmetric SEED that operates when the externally supplied voltage is zero. FIG. 1 shows a self-biased S-SEED having quantum well diodes 1 and 3. The top quantum well diode is more absorbing than is the bottom quantum well diode. The voltage at the left node is $V_{ref}$. The voltage across the bottom quantum well diode from left to right, i.e., the voltage at the right node, is approximately $V_{ref}+1$ volt. FIG. 2 shows the same S-SEED but with the bottom quantum well diode being more absorbing than is the top quantum well diode. The voltage across the bottom quantum well diode from left to right is approximately $V_{ref}-1$ volt. FIGS. 1 and 2 thus illustrate the two optical states of the self-biased S-SEED. For purposes of illustration, we will describe the operation of the device using 1 V as a typical forward bias operating voltage for the diodes. It will be understood by those skilled in the art that forward bias operating voltages may be different from 1 V. Operating voltages will then be adjusted accordingly.

Figure 3:
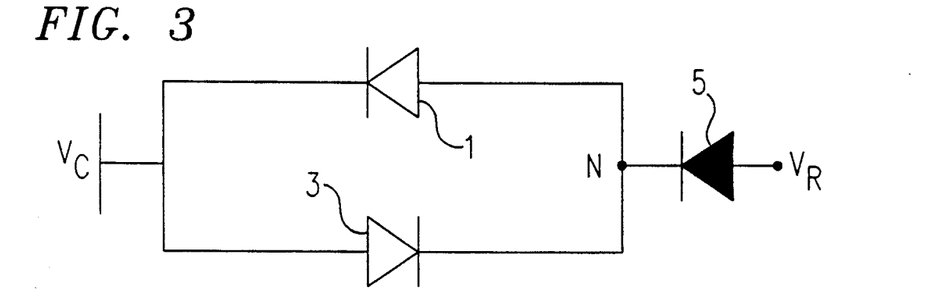

FIG. 3 shows a single cell according to this invention. In this cell, only one of the two possible states can be set electrically; reset to the other state must be done optically. In an array, reset would be done globally. In addition to the self-biased S-SEED depicted in FIGS. 1 and 2, there is an electrical diode 5 connected to a common node of the S-SEED. Optical diodes are shown as open triangles; diodes which need not be optical diodes are shown as solid triangles. The addressing means comprises the electrical diode 5; i.e., diode 5 is an element which can be enabled and disabled electrically and used to set the desired state of the SEED. The diode 5 may be a quantum well diode although it need not be; its only function is as an electrical diode. The voltages applied to the quantum well diodes and the electrical diode 5, respectively, are $V_C$ and $V_R$. These represent row and column voltages, respectively. The row voltage is applied to the addressing means. The voltage, $V_N$, at the common node, N, of the S-SEED determines the state of the cell. If $V_C$ is greater than is $V_R 1$ V, the self-biased SEED can be in either state, i.e., either logic "1" where $V_N=V_C+1$ V or logic "0" where $V_N=V_C-1$ V, because the electrical diode is then not forward biased and can have an arbitrary reverse bias voltage across it over the voltage range of interest. In a steady state, it is desirable to maintain $V_C-V_R>2$ volt to ensure that the electrical diode is reverse biased. If, however, the electrical diode becomes forward biased, then the S-SEED is set into the logic 1 state where $N_N=V_C+1$ if it was not already in that state. This condition can be ensured by having $V_C-V_R<-2$ volts. Proper operation requires only that $V_C$ and $V_R$ toggle between two voltage levels which will be called disable and enable. The electrical diode becomes forward biased and the device switches to the logic 1 state only when both $V_C$ and $V_R$ are at the enable level. If either or both $V_C$ and $V_R$ are at their disable level, the electrical diode remains reverse biased, i.e., disabled, and the electrical state remains unchanged. This technique can be used to set an entire row of devices in a single cycle. For the steady state, both $V_R$ and $V_C$ are returned to their disable levels and device states are held due to optical bistability.

Exemplary voltages for the two buses are:

|  | Disable | Enable |
| --- | --- | --- |
| $V_R$ | −6 volts | −2 volts |
| $V_C$ | 0 volts | −4 volts |

Figure 4:
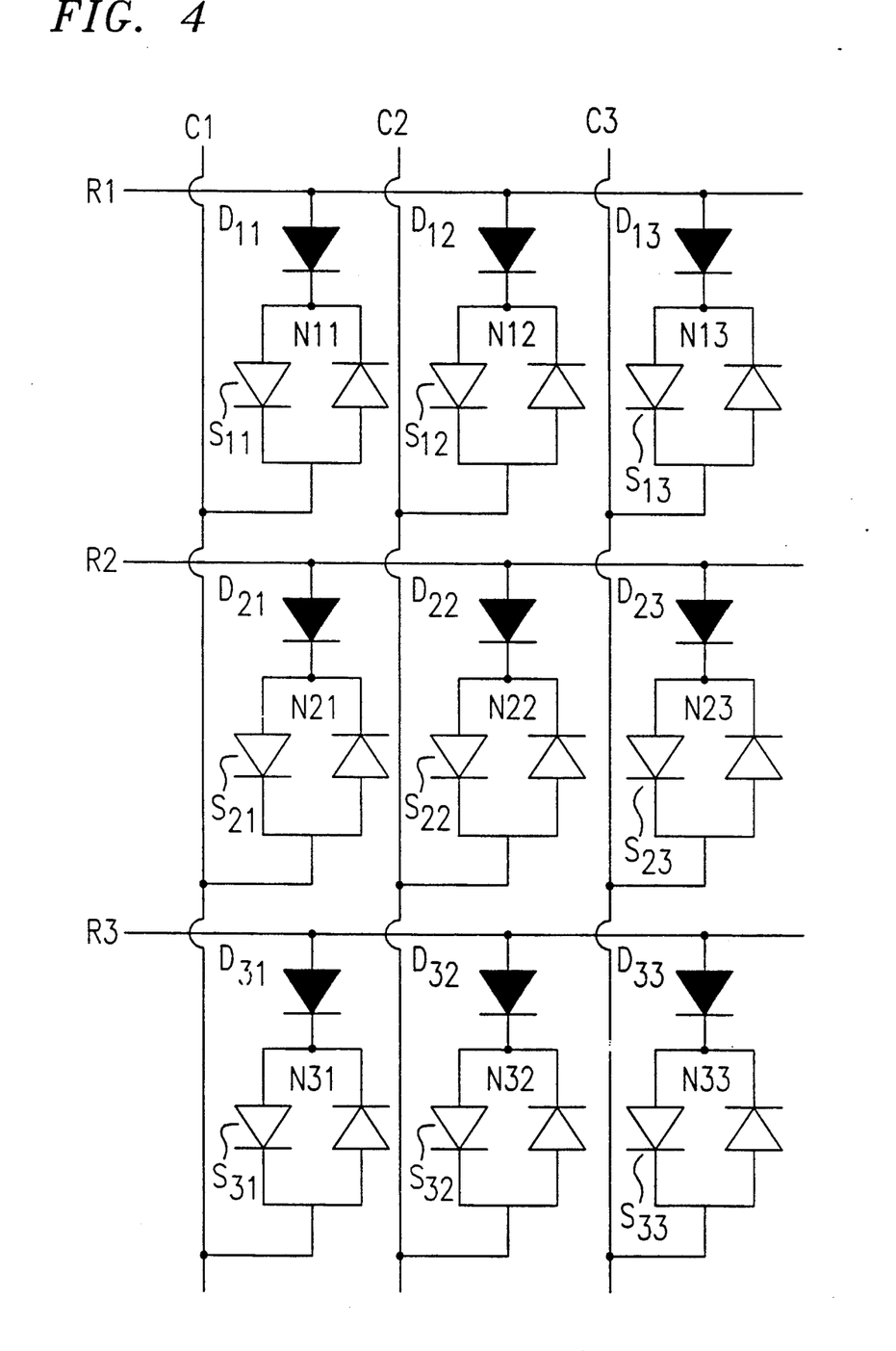
FIGS. 4 and 5 are schematic layouts of an array of matrix addressed S-SEEDs with addressing means comprising diodes.

An embodiment of the invention with addressing means comprising diodes, i.e., the elements are diodes, is schematically represented in FIG. 4. Shown is a 3×3 array of self-biased S-SEEDs, as described with respect to FIG. 3. There are three rows Ri, i=1, 2, 3 and three columns Cj, j=1, 2, 3. There is a plurality of electrical column buses and row buses. The individual S-SEEDs are indicated by their row and column numbers. For example, the S-SEED in the second row and third column is $S_{23}$. Diodes, also indicated by row and column number, are located at the intersections of row and column buses. One common node $J_{ij}$ of the S-SEED, $S_{ij}$, is connected to one terminal of the diode $D_{ij}$ which has its other terminal connected to a row bus; i.e., the row bus is connected to the addressing means. The other common node of the S-SEED is connected to the column bus.

Operation of the matrix addressed array of optical modulators is now easily understood. First, the entire array is globally optically reset, so that all devices are in the logic 0 state. Optical reset can be accomplished, for example, by shining a light beam only on the right-hand side of each symmetric SEED pair in FIG. 4 with all row and column voltages at their levels. A single row bus can be then set to the enable level with all other rows set to the disable level. Then the column voltages could be set to either enable or disable to set the devices only in that row to the logic 1 state or to hold the logic 0 state. After the buses return to their disable levels, the states are held by the optical bistability. Optical bistability can be held, for example, by shining equal light beam powers on all optical diodes with the wavelength chosen to give bistable operation of the SEED. This procedure is then repeated for the other rows until the entire array has been set. The devices can be illuminated throughout the procedure.

The array depicted is for purposes of illustration only. Typically, the array will be much larger and many more S-SEEDs will be present. It is also to be understood that the array need not be symmetric, i.e., there may be unequal numbers of rows and columns. The diodes, $D_{ij}$, depicted are addressing means which are connected to the row buses; embodiments using other addressing means will be described and still other embodiments will be apparent to those skilled in the art.

Figure 5:
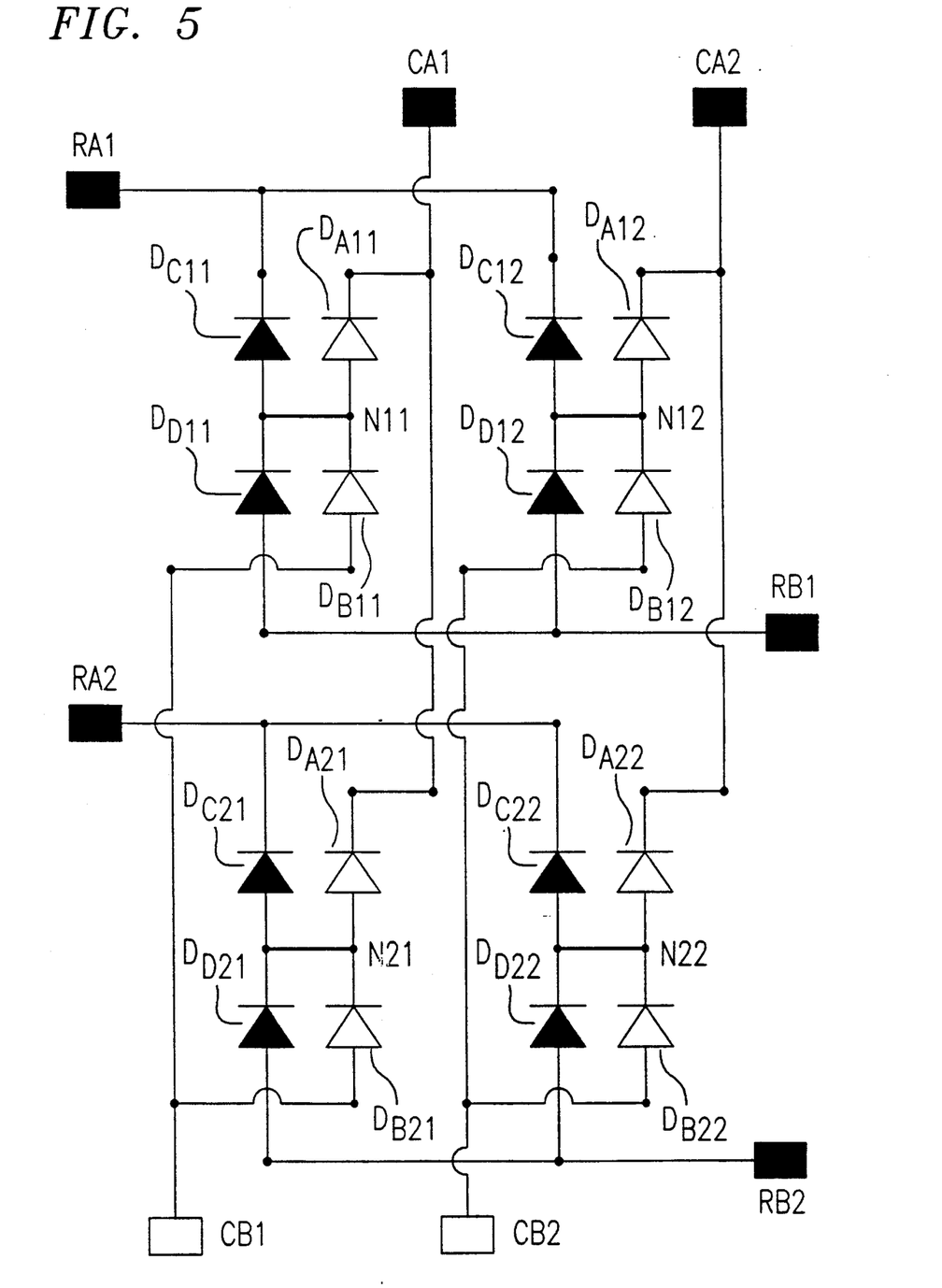

Self-biased S-SEEDs operate at low voltages. These SEEDs require fewer buses than do externally biased SEEDs, but optical bistability is difficult to obtain at low voltages and the contrast may be low. The single addressing diode switches in only one direction so that the cell needs an optical reset. A two-diode embodiment, whereby either of the two states can be electrically set, is more likely to be used. An embodiment using series connected diode pairs as the elements for the addressing means is illustrated in FIG. 5. This embodiment is shown for purposes of explanation with externally biased S-SEEDs. The upper and lower SEED and electrical diodes are referred to as $D_{Aij}$ and $D_{Bij}$, and $D_{Cij}$ and $D_{Dij}$, respectively, for the cell in row i and column j. Each row and column has two voltage buses, which are indicated as RAi and RBi, and CAj and CBj, respectively. In the steady state, each cell has a reverse biased S-SEED whose center node $N_{ij}$ is connected to the center node of the two reverse biased series connected electrical diodes. When illuminated with equal intensity CW beams at $\lambda_o$, the exciton wavelength, the S-SEEDs are bistable. All devices are in one of two possible states $V_{Nij} = V_{CAj}$ or $V_{CBj}$. The former state will be defined as logical "1," and the latter state as logical "0." For logical "1," the reflectivity of $D_{Aij}$ is low, and the reflectivity of $D_{Bij}$ is high. For logical "0," the reflectivities are reversed. As it did for the previous embodiment, switching occurs when one of the electrical diodes is forward biased or enabled; when the diodes are reverse biased, the electrical diodes are disabled.

Proper operation requires that the row voltages toggle between two levels, enable and disable, and that the column voltages toggle between three levels, enable "1," disable and enable "0." Note that buses RAi and RBi and buses CAj and CBj must swing in tandem. Assuming a multiplicative constant Vo, exemplary voltages are:

|    | Disable | Enable |    | Enable "1" | Disable | Enable "0" |
|----|---------|--------|----|------------|---------|------------|
| RA | $3 V_o$ | $V_o$  | CA | $-V_o$     | $-V_o$  | $3 V_o$    |
| RB | $-3 V_o$| $-V_o$ | CB | $-3 V_o$   | $-V_o$  | $V_o$      |

From one to all devices in a row can be switched to designated states during one switching sequence. Devices in the same column can only be switched to the same state during one switching sequence. This is true because swinging the row voltages enables switching, while swinging the column voltages determines the final state. Devices whose row buses are held at, e.g., $\pm 3$ Vo remain latched in their initial states, even if the column buses swing, since switching is disable. Devices whose column buses are held at $\pm$Vo remain latched in their initial states, even if the row buses swing to enable switching since only the column buses actually perform switching.

A more precise analysis for a $V_o \geq 0$ volts yields the following table:

|    | Disable    | Enable     |    | Enable "1"  | Disable | Enable "0" |
|----|------------|------------|----|-------------|---------|------------|
| RA | $3 V_o + 6$| $-V_o + 2$ | CA | $-V_o - 4$  | $V_o$   | $3 V_o + 4$|
| RB | $-3 V_o - 6$| $-V_o - 2$| CB | $-3 V_o - 4$| $-V_o$  | $V_o + 4$. |

This, however, requires up to ten different voltage settings, rather than the four different voltage levels required for a relatively large $V_o$ as previously discussed.

Figure 6:
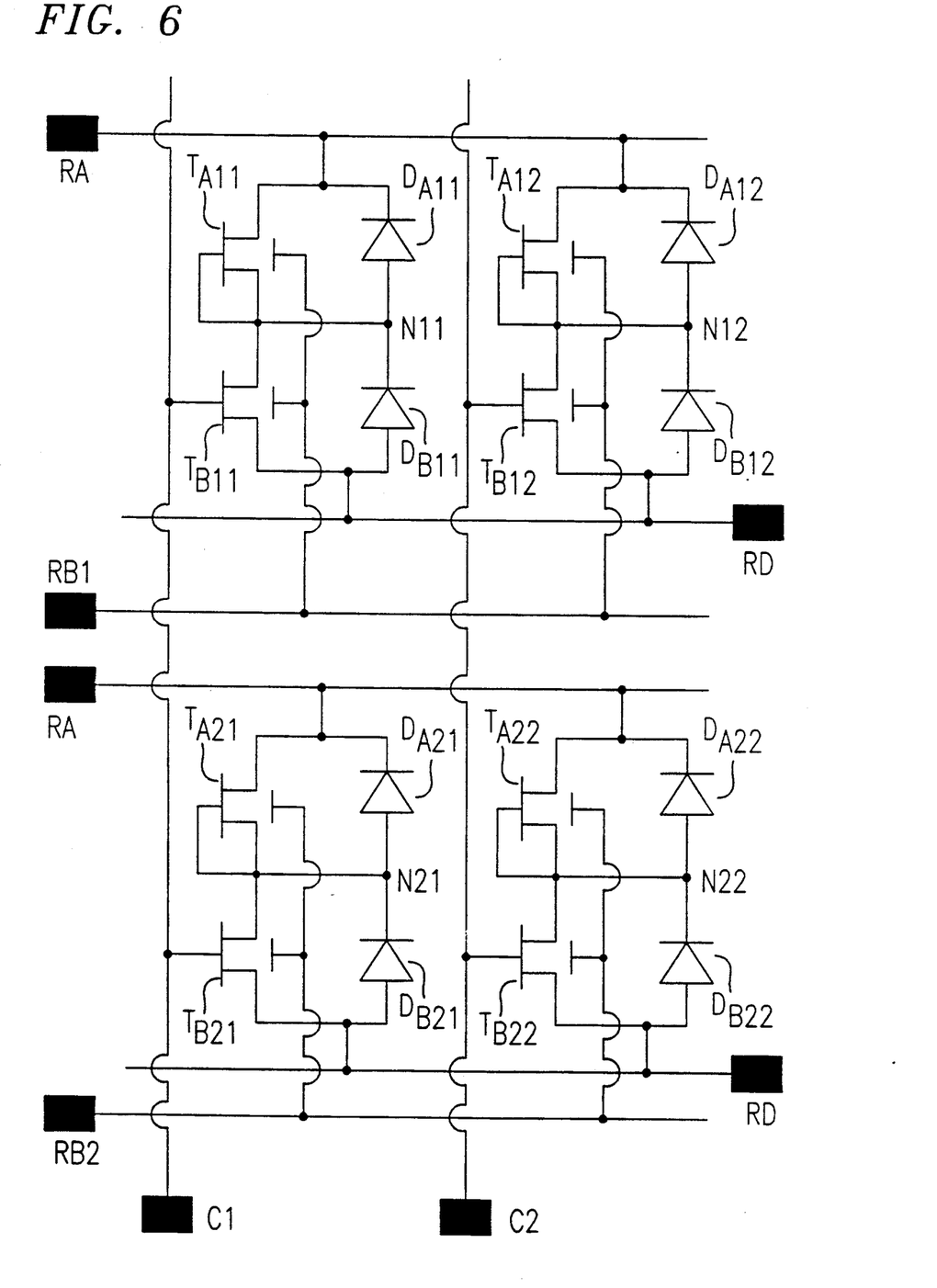
FIG. 6 is a schematic layout of an array of matrix addressed S-SEEDs with addressing means comprising transistors.

Another embodiment is depicted in FIG. 6. In this embodiment, the addressing means comprise field-effect transistors (FETs). Each cell consists of an S-SEED having QW diodes $D_{Aij}$ and $D_{Bij}$, reverse-biased in series, whose center node $N_{ij}$ is connected to the center node of two FETs $T_{Aij}$ and $T_{Bij}$ and also biased in series between the same two DC voltages. The bias voltages are brought in by row buses RA and RD and $V_{RA}$ is positive with respect to $V_{RD}$. All the RA buses can be connected in common outside the array as can all the RD buses. Only two external connection pads are needed per array chip for the bias buses. Each FET is depletion-mode and has a normal "top" gate above the channel and another "bottom" gate underneath the channel; either gate can modulate or even pinch off the current in the channel. However, if one gate turns a FET off, the other cannot turn it back on. Both FETs, $T_{Aij}$ and $T_{Bij}$, can be identical in structure. In a preferred embodiment, the bottom gates of both FETs are connected together and the gate voltage is controlled by row bus RBi. The top gate of the FETs, $T_{Aij}$, is connected to its own source, and the top-gate to source voltage difference is always zero. The $T_{Aij}$ source is connected to node Nij. The voltage on the top-gate of each FET $T_{Bij}$ is controlled by column bus Cj.

Figure 7:
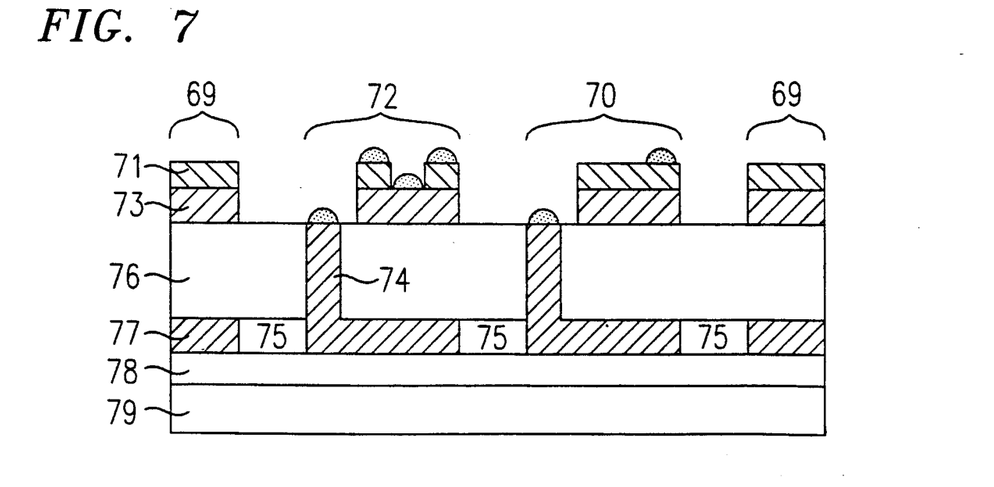
FIG. 7 is a sectional view of a structure suitable for fabricating the transistors and quantum well diodes.

FIG. 7 is a schematic sectional view of a FET 72 and a QW diode 70 fabricated in a monolithically integrated structure to be interconnected to form the cell circuits of FIG. 6. The regions 69 depict the layers as grown and prior to processing. There are layers 71, 73, 76, 77, and 78 which have first, different first, intrinsic, second and intrinsic conductivity types, grown on a semi-insulating substrate 79. Layer 76 is the quantum well stack. The FET has source, top-gate and drain contacts to layers 71, 73, and 71, respectively. It also has a contact to layer 77, underneath, through a second conductivity type implanted column 74 to form the bottom-gate. The QW diode has similar contacts to layers 71 and 77. A deep isolation implant 75 into layer 77 isolates the components. Layer 78 is a Bragg reflector stack for the QW diode. Appropriate materials, such as Group III-V compound semiconductors, will be readily selected by those skilled in the art and the structure fabricated. In a preferred embodiment, the first conductivity type is n-type. Layers 71 and 77 are typically highly doped.

The operation of a cell is as follows. Equal intensity laser beams, at the exciton wavelength for optical bistability, impinge on each diode. The bias voltages and the illumination onto the diodes are never varied. In steady state, the transistors are disabled and the cell state is held by optical bistability, where, for instance, logical "1" is when $V_{Nij} \approx V_{RD}$ (reflectivity of $D_{Aij}$ low; reflectivity of $D_{Bij}$ high) and logical "0" is when $V_{Nij} \approx V_{RD}$ (reflectivity of $D_{Aij}$ high; reflectivity of $D_{Bij}$ low). The reflected beams are an optical differential read-out of the device state. For switching, the row lead RBi and the column lead Cj need to toggle between only two voltage levels, which can be referred to as disable and enable for RBi and enable "1" or enable "0" for Cj. For RBi, disable is the bottom gate pinch-off voltage, Vpb and enable is when $V_{RBi} \approx V_{RD}$. As long as RBi is at the disable level, neither transistor can turn on. When RBi is set to the enable level, FET $T_{Aij}$ turns on and begins to draw $V_{Nij}$ to $V_{RA}$ to set the device in the logical "1" state. (Note that for proper operation $|V_{pb}| < |V_{RA} - V_{RD}|$; otherwise, $T_{Aij}$ would turn off before $V_{Nij}$ can reach $V_{RA}$.) The enable "1" level for Cj then is near or at the threshold voltage of the top-gate, (the applied gate voltage which equals the top-gate pinch-off voltage minus a built-in voltage); since then $T_{Bij}$ draws little or no current and allows $T_{Aij}$ to draw $V_{Nij}$ to $V_{RA}$. The enable "0" level for Cj then is $V_{RD}$ (the source voltage of $T_{Bij}$) if $T_{Bij}$ is made wider than $T_{Aij}$, or, approximates $V_R + 0.5$ volts if the two FETs are of equal width. When Cj is at the enable "0" level, $T_{Bij}$ draws more current than does $T_{Aij}$, overwhelming $T_{Aij}$, and draws $V_{Nij}$ down to $V_{RD}$. Since Cj can control only $T_{Bij}$ and not $T_{Aij}$ and, since the conductivity of $T_{Aij}$ depends somewhat on $V_{Nij}$, it is unlikely that there will be a "hold" level for Cj which will allow the device to still hold its state when RBi is at the enable level. That is, unless the design is made carefully, it may be difficult to find a level for Cj where the currents of the two transistors nearly balance and their difference is less than the difference between photocurrents and optical bistability maintains the state. Assuming equal width FETs, a top-gate threshold = −0.5 V and a bottom-gate pinch-off voltage = −10 V, and that Gd indicates ground; then proper operation can be obtained with the following:

| | | Exemplary Voltages | | | |
|---|---|---|---|---|---|
| | | RBi | | Cj | |
| RA | RD | enable | disable | enable "1" | enable "0" |
| +6 V | Gd | Gd | −10 V | −0.5 V | +0.5 V |

A matrix-addressing procedure is as follows. Due to the lack of a "hold" level for Cj, only row addressing is possible and not random single-device switching. Place the column buses, Cj, at the appropriate enable "1" or enable "0" level. Raise the one appropriate row bus RBi to enable while holding the others at disable. When all devices in the chosen row switch, return the RBi bus to disable.

This embodiment is desirable because decision circuits which set the state need only a 1-volt swing rather than the 6 volts or more needed for the previously described embodiments. However, larger cells will typically be required than will be needed for other embodiments. Also, single devices can not be switched. This is not likely to be a significant drawback as row switching will typically be the preferred switching procedure.

Figure 8:
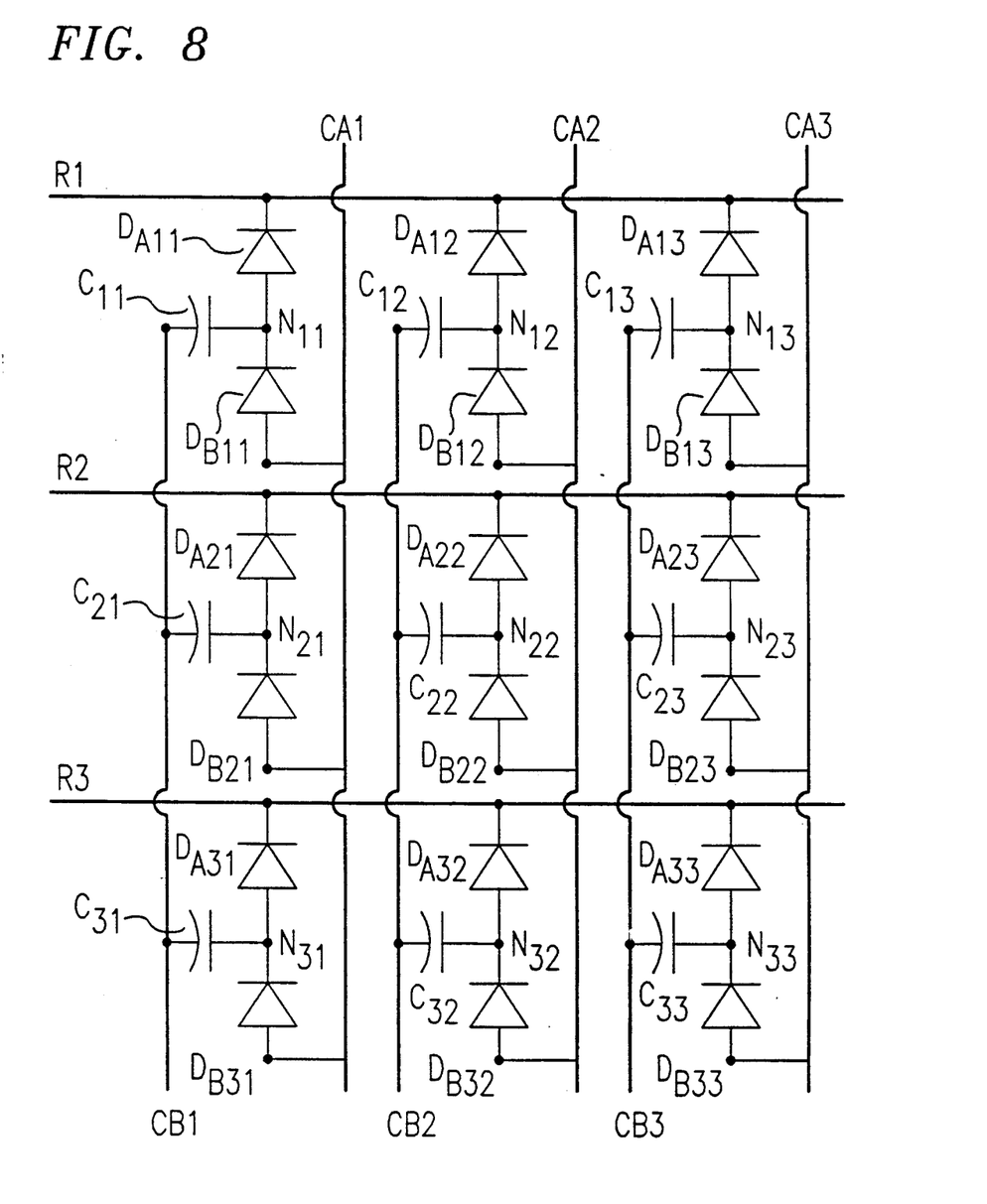
FIG. 8 is a schematic layout of an array of matrix addressed S-SEEDs with addressing means comprising capacitors.

Another embodiment of the invention is depicted in FIG. 8. In this embodiment, the elements of the addressing means comprise capacitors. A capacitor, indicated by row and column number, is located near each S-SEED, QW diodes $D_{Aij}$ and $D_{Bij}$, reverse-biased in series, between row lead Ri and column lead CAj. One terminal of each capacitor Cij is connected to the common node Nij of the S-SEED and the other terminal is connected to the column connection, CBj. The capacitance of each Cij is CC.

This embodiment takes note of the fact that when the voltage across a capacitor is varied, displacement currents are generated. Such currents can be used to switch the devices in this embodiment. It is also important to note that p-i-n diodes, such as the SEED QW diodes, behave as capacitors when reverse-biased electrically and, unlike some junction diodes, have essentially a voltage independent capacitance, CD. To perform matrix addressing, there must be a method of enabling and disabling the switching by the addressing element. The displacement current in Cij must be disabled in devices which are not to switch. One method of doing this was described in U.S. Pat. No. 4,914,286, issued on Apr. 3, 1990 to L. M. F. Chirovsky et al., which described how an S-SEED can be operated as a sense-amplifier. The bistable S-SEED has two stable states of $V_{Nij} \approx V_{Ri}$ (logical "1") and $V_{Nij} \approx V_{CAj}$ (logical "0"); but, there is also a metastable state at $V_{Nij} = (V_{Ri} + V_{CAj})/2$. Near the stable states, the photocurrents oppose the displacement currents (or any switching currents); but near the metastable state they tend to reinforce the switching currents. The basic principle of operation of this embodiment is the generation of displacement currents which are too small to switch devices in their stable states, but large enough to switch devices placed in their metastable state. One convenient way to place an S-SEED in its metastable state is to forward-bias it and then to reverse-bias it again by swinging the bias buses Ri and CAj.

In general, the change with time in the voltage at node Nij is given by $$\dot{V}_{Nij} = \frac{CD\dot{V}_{Ri} + CD\dot{V}_{CAj} + CC\dot{V}_{CBj} + P_{DAij}S_{DAij} - P_{DBij}S_{DBij}}{2CD + CC}$$

where $P_{DAij}(P_{DBij})$ and $S_{DAij}(S_{DBij})$ are respectively the incident optical power on and the responsivity of diode $D_{Aij}(D_{Bij})$. After a switching procedure:

$$V_{Nij} \text{ (final)} = \int \dot{V}_{Nij} dt + V_{Nij} \text{ (initial)}$$

Any procedure for which the integral always equals zero for devices found in a stable state, and always equals either the full reverse bias (for logical 0→1); or, the negative of the full reverse bias (for 1→0); or, zero (for 0→0,1→1) for devices placed in the metastable state, is a workable switching procedure.

One exemplary three-step procedure follows. All devices are illuminated throughout the procedure. In steady state, all row buses, Ri, are at +Vo, all column buses, CAj, are at −Vo, and the column buses CBj are at ground or +V1. To switch a specific cell nm: in step a, swing lead Rn to −1 V, lead CAm to +1 V and lead CBm to +V1 (if logical "0" is to be set) or to ground (if logical "1" is to be set). In step b, return lead Rn to +Vo and lead CAm to −Vo. Device nm is now In step c, swing lead CBm down from +V1 to ground (for "0") or up from ground to +V1 (for "1"). The displacement current partially switches the device in the metastable stage, and the photocurrents complete the switching. This procedure depends greatly on having very nearly equal beam intensities on both diodes of a device so that the photocurrents are balanced at the metastable state. Beginning step b before step c is completed can compensate for some photocurrent imbalances. Note that all buses toggle between only two voltages.

Another exemplary switching procedure will be briefly described. All column buses CAj are at a common ground. The device states are held indefinitely if the row buses Ri are held at a bias voltage Vo, and the column buses CBj are held at either Vo or Gd with each diode illuminated at an appropriate intensity. The device states are read with parallel equal intensity optical beams. Each device has two stable states with $V_{Nij} \approx -1$ (logical "0") or Vo+1 volts (logical "1"). All devices in a row n are switched as follows. Illuminate the array with equal high intensity beams and swing the bottom column buses to ground and the designated row bus, Rn, to ground. The node voltages $V_{Nnj}$ go to ground so these states are erased but other states (devices in all other rows) are maintained due to the photocurrents. The illumination is turned off and the designated row voltage Rn is switched to Vo as are all the column buses CBj for the devices which are to be switched to the logical "1" state. The column buses CBj are maintained at ground for the devices to be switched to the logical "0" state. This step partially switches the devices. The array is again illuminated with high intensity beams and the photocurrents will cause the devices to complete the switching, and devices in the other rows to recover if they are partially perturbed by the swinging of their CBj bus.

The capacitances of the capacitor and the S-SEED diodes are represented by CC and CD, respectively. It can be shown that partially switched devices will complete switching if $(4CD/(V_o-2))<CC<2CD$. Vo is typically greater than 6 volts and CC and CD may be approximately equal.

The cells in FIG. 8 may also be selected randomly and switched in another way. In the steady state, column buses CAj must be individually biased to $-V1$; the row buses, Ri, to $+V1$, and the column buses CBj to either $+V1$ or $-V1$. First, the modulators are illuminated with equal high intensity beams while the row bus Rn and column buses CBm and CAm are brought to ground. THe node voltage $V_{Nnm}$ will go to ground and the state of the modulator will be erased. In the next step, the illumination is turned off and the CBm bottom bus is brought to V1 or to $-V1$, depending upon whether the final state is to be logical "1" or logical "0," respectively. The modulators in the mth column which are not to be switched may be partially perturbed. Finally, all modulators are again illuminated with high intensity beams while the row lead Rn is brought to V1 and the column CAm lead is brought to $-V1$. The photocurrents then complete the switching of device nm and return the perturbed devices to their original states. If exact timing is difficult, it is desirable that the beginning of illumination slightly lag the beginning of the voltage swing; otherwise, photocurrents may erase the effect of the swing of the lead CBn in the second step.

An analysis of the relationship between voltage and capacitances may be performed and it will show that the modulators will either switch or recover when $(2CD/(V1-1))<CC<2CD$ and $V1>1+(2CD/CC)$. Again, CD may be approximately equal to CC and $V1>3$ V. Many other procedures satisfying equation (2) can be conceived by those skilled in the art.

Figure 9:
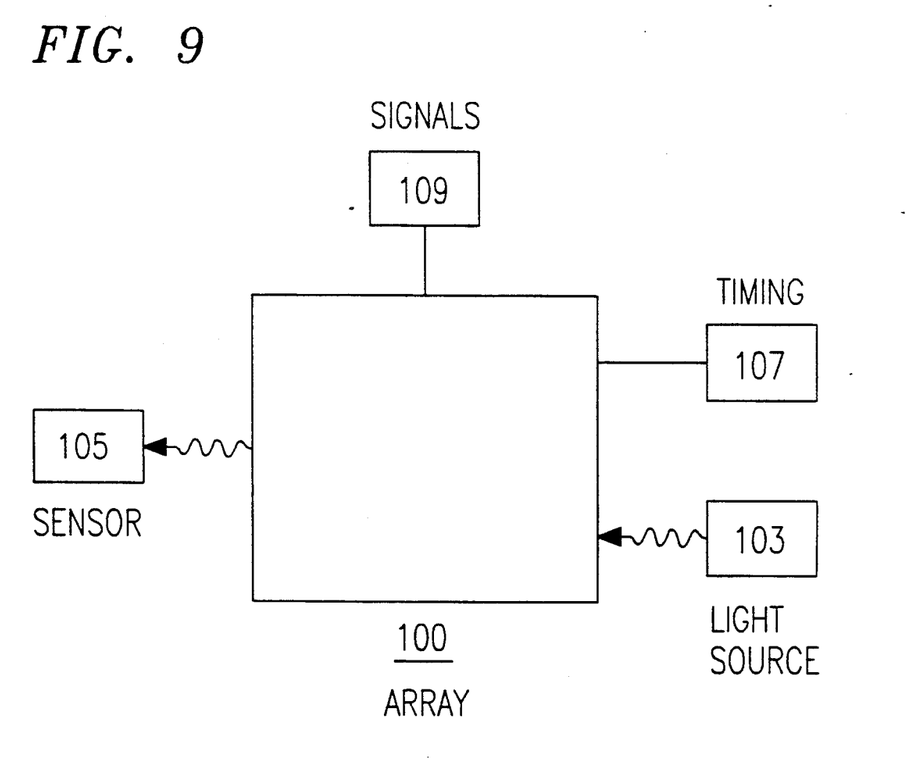
FIG. 9 is a block diagram of apparatus according to one embodiment of this invention.

Apparatus according to this invention is schematically depicted in FIG. 9. Array 100 comprises an array of S-SEEDs with appropriate addressing means. Light source 103 illuminates the array while timing unit 107 comprises the circuitry for turning the light source 103 on and off as needed and the electrical signals to the array. Unit 109 generates the electrical signals sent to the addressing means to set the device states. Sensor 105 detects the light from SEED arrays. Those skilled in the art will readily fabricate the elements depicted.

Variations of the embodiments described will be readily thought of by those skilled in the art. For example, devices, such as reverse biased SEEDs, other than S-SEEDs may be used as the optical modulators. The electrical diode may be a quantum well diode. The capacitors Cij may be caused just by parasitic capacitance between lead CBj and each S-SEED, rather than a device explicitly designated as a capacitor. Other variations will be readily apparent to those skilled in the art.

We claim:

1. An electrically addressed array comprising:
   a plurality of bistable S-SEED differential modulators, each S-Seed having a center node, said plurality being arranged in an array comprising a plurality of columns and a plurality of rows;
   a plurality of addressing means, one addressing means being electrically connected to said center node of one S-SEED modulator, said addressing means comprising elements which can be enabled and disabled electrically;
   a plurality of electrical column buses; and
   a plurality of electrical row buses, at least one of said row buses and said column buses being electrically connected to at least one of said plurality of addressing means.

2. An array as recited in claim 1 in which said addressing elements comprise diodes.

3. An array as recited in claim 2 in which said diodes comprise series connected diode pairs, the center node of each of said pairs being connected to the center node of said S-SEED modulator.

4. An array as recited in claim 1 in which said elements comprise transistors.

5. An array as recited in claim 1 in which said elements comprise capacitors.

6. Apparatus comprising the array as recited in claim 1 and a light source for illuminating said array.

7. Apparatus as recited in claim 6 further comprising a sensor for detecting light from said array.

8. Apparatus as recited in claim 7 further comprising a unit for generating electrical signals to said addressing means.

9. Apparatus as recited in claim 8 further comprising a timing unit for turning said light source on and off.

* * * * *